United States Patent [19]

Sato et al.

[11] Patent Number: 4,839,865
[45] Date of Patent: Jun. 13, 1989

[54] SELECTIVE APPLICATION OF VOLTAGES FOR TESTING STORAGE CELLS IN SEMICONDUCTOR MEMORY ARRANGEMENTS

[75] Inventors: Katsuyuki Sato; Hiroshi Kawamoto, both of Kodaira; Kazumasa Yanagisawa, Kokubunji, all of Japan

[73] Assignee: Hitachi, Ltd., Tokyo, Japan

[21] Appl. No.: 934,666

[22] Filed: Nov. 24, 1986

[30] Foreign Application Priority Data

Nov. 22, 1985 [JP] Japan .................................. 60-261154

[51] Int. Cl.$^4$ .......................... G11C 7/00; G11C 11/42
[52] U.S. Cl. ..................................... 365/201; 365/226; 365/189.09; 307/296 R
[58] Field of Search ............... 365/201, 149, 226, 190; 371/21; 307/296 R, 304

[56] References Cited

U.S. PATENT DOCUMENTS

| | | | |
|---|---|---|---|
| 4,418,403 | 11/1983 | O'Toole et al. | 371/21 X |
| 4,519,076 | 5/1985 | Priel et al. | 371/21 |
| 4,527,254 | 7/1985 | Ryan et al. | 365/201 X |
| 4,549,101 | 10/1985 | Sood | 365/201 X |
| 4,616,143 | 10/1986 | Miyamoto | 365/226 X |
| 4,638,460 | 1/1987 | Matsumoto | 365/203 X |
| 4,680,762 | 7/1987 | Hardee et al. | 365/201 X |

OTHER PUBLICATIONS

Nikkei Electrnics Feb. 11, 1985 pp. 243-263.

Primary Examiner—Stuart N. Hecker
Assistant Examiner—Alyssa H. Bowler
Attorney, Agent, or Firm—Antonelli, Terry & Wands

[57] ABSTRACT

A dynamic RAM is provided with a plurality of 1-MOSFET memory cells, each having a storage capacitor and a switching MOSFET coupled to one electrode of the storage capacitor. The other electrode of each of the storage capacitors is coupled to a switching circuit which controls the voltage which is applied to the capacitor. The switching circuit is, in turn, coupled to both a voltage generating circuit (which preferably provides a voltage of ½ Vcc) and a voltage supply circuit which is set to provide predetermined test voltages. Thus, by operating the switching circuit, a voltage of ½ Vcc can be applied to the memory cell capacitors during normal operation of the dynamic RAM, and the predetermined test voltages can be applied to the memory cell capacitors during a testing operation.

15 Claims, 3 Drawing Sheets

SELECTIVE APPLICATION OF VOLTAGES FOR TESTING STORAGE CELLS IN SEMICONDUCTOR MEMORY ARRANGEMENTS

BACKGROUND OF THE INVENTION

The present invention relates to a semiconductor memory, for example, of the type utilized in a dynamic RAM (random access memory).

A memory cell of one bit in a dynamic RAM comprises a MOSFET type memory cell, i.e., a data storage capacitor and an address selecting MOSFET, and data of logic "1", "0" is stored in form of charge in the capacitor. Reading of data is performed in that the MOSFET is rendered on and the capacitor is connected to a data line, and how the potential of the data line varies corresponding to the charge stored in the capacitor is sensed using the reference potential. The capacitor utilized here is a MIS (metal insulator semi-conductor) capacitor between a gate electrode and a channel. Fixed potential is supplied steadily to the gate electrode. A system of supplying voltage ½ Vcc, i.e. a half of the source voltage Vcc, to the gate electrode of the MIS capacitor of the memory cell is disclosed, for example, in U.S. Pat. application Ser. No. 530,079 now U.S. Pat. No. 4,638,460 filed on Sept. 7, 1983. One system of forming the read reference potential of the memory cell is a falf precharge system of the data line (or dummy cell-less system), for example, disclosed in Isscc Digest of Technical Papers, 1984, p 276-p 277 or "Nikkei Electronics" p 243-p 263, published on Feb. 11, 1985 by Nikkei McGraw-Hill, Inc.

SUMMARY OF THE INVENTION

Methods of estimating margin of the charge stored in the capacitor of the dynamic memory cell includes a bump test of the source voltage and a margin test of the operating source voltage. In these tests, data is written when the state of the source voltage is 4–6 V, for example, and not when it is in the state of Vcc=5 V, and the written data is read when the source voltage value is equal to or different from the source voltage value when information is being written into the memory cell.

Estimation by these tests is not always satisfactory, because the selection range of the source voltage is limited, and the fixed potential applied to the capacitor and the read reference potential vary corresponding to variation of the source voltage. Also, since these tests perform estimation including the margin of the peripheral circuit such as voltage generating circuit, the margin estimation of the stored charge does not become accurate. Consequently, the soft error rate cannot be accurately determined thereby resulting in deterioration of reliability and yield.

Moreover, since the potential applied to the dielectric film cannot be made high enough on account of the above-mentioned reason, adequate testing regarding the destruction characteristic of the film cannot be performed.

An object of the invention is to provide a semi-conductor memory having an added circuit function to enable estimation of the memory cell.

Another object of the invention is to provide a semi-conductor memory having high reliability.

Still another object of the invention is to provide a semiconductor memory having a circuit function which can estimate reliability with high accuracy with a simple construction.

The foregoing and other objects and novel features of the invention will be apparent from the following description of the specification taken in conjunction with the accompanying drawings.

A typical example of the invention disclosed in the present specification will be briefly described as follows. Fixed potential is supplied to a capacitor of a dynamic memory cell during operation through a switch, and during the test the switch is turned off and predetermined test voltages can be supplied to the capacitor.

DESCRIPTION OF THE PREFERRED EMBODIMENTS

Figure 1:
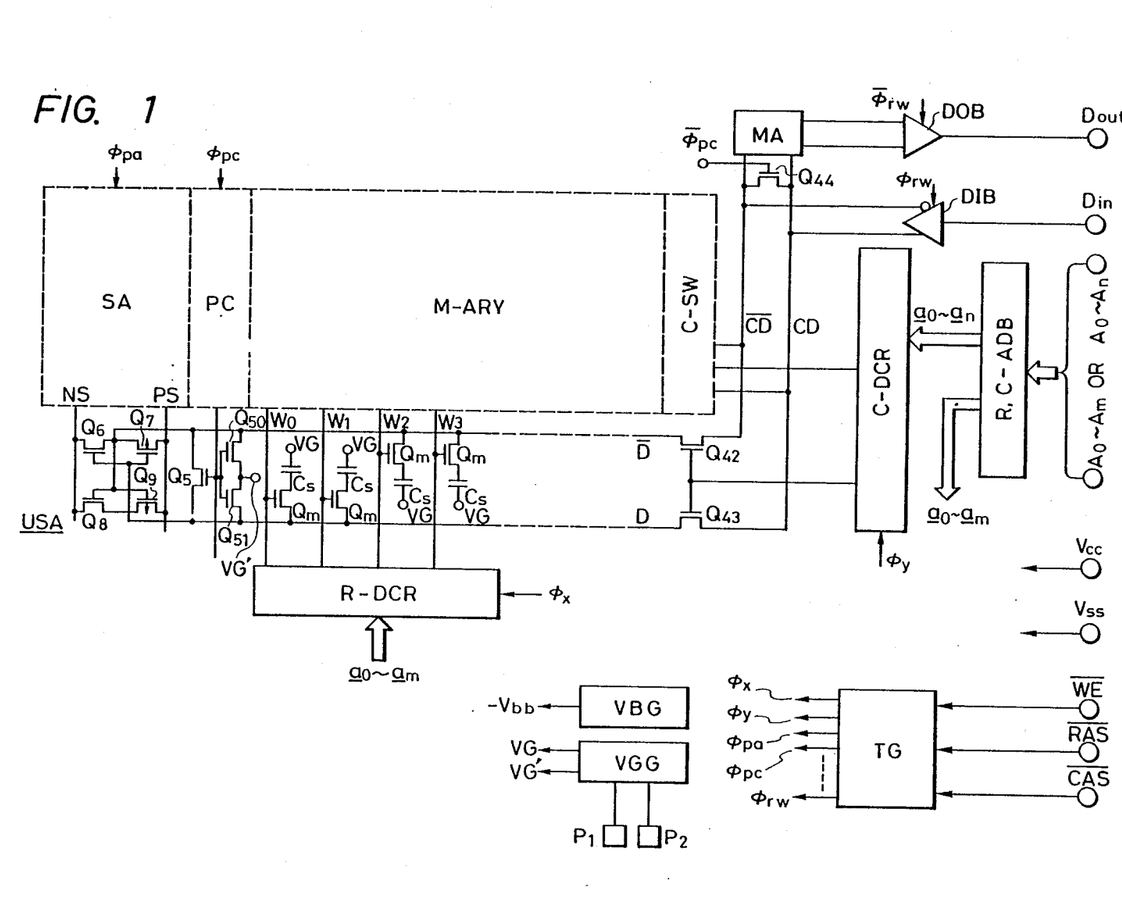
FIG. 1 is a circuit diagram of a dynamic RAM according to the invention.

FIG. 1 shows a circuit diagram of an embodiment of the invention applied to a dynamic RAM. Each circuit element of FIG. 1 is formed on a semiconductor substrate such as of the monocrystalline silicon type using known manufacturing technology of CMOS (complementary MOS) integrated circuit.

The memory array M-ARY is made of the folded bit line type although not particularly limited thereto. FIG. 1 shows a pair of rows thereof specifically. To a pair of complementary data lines (bit lines of digit lines) D, $\overline{D}$ arranged in parallel are connected a plurality of memory cells each composed of an address selecting MOSFET Qm and a data storing capacitor Cs with respective input/output nodes arranged in prescribed regularity. A word line W extends in the longitudinal direction within the memory array, and one end of the word line W is connected to a row decoder R-DCR. The data line D extends in the lateral direction within the memory array, and one end of the data line D is connected to a sense amplifier SA and other end thereof is connected to a column switch C-SW.

In this embodiment, in order to reduce deterioration of a dielectric film of the capacitor, plate voltage VG, set to Vcc/2, is supplied to the gate electrode (plate electrode) of the data storing capacitor Cs of the MIS capacitor constituting the memory cell. The plate voltage VG is formed by a voltage generating circuit VGG. The voltage generating circuit VGG will be described in detail afterwards referring to FIG. 2. Electrodes (probe testing pads) P1, P2 for enabling the application of predetermined test voltages by a testor or a prober are added to the voltage generating circuit VGG according to the invention. The electrodes P1, P2 are distinguished from electrodes used as external terminals of the semiconductor memory, such as data output terminal Dout (electrodes each indicated by circle in FIG. 1). Since the plate voltage VG during a test can be made to have predetermined values using the electrodes P1, P2, estimation of the capacitor Cs can be performed accurately.

A precharge circuit PC is constituted by a switch MOSFET installed between the complementary data lines D, $\overline{D}$, such as MOSFET Q5 shown as representative. Precharge signal $\phi$pc is supplied to gate of the MOSFET Q5, such that the MOSFET Q5 is turned on during the chip non-selective state. Consequently, during the previous operation cycle, high level and low level of the complementary data lines D, $\overline{D}$ by means of amplifying operation of the sense amplifier SA, as hereinafter described, are short-circuited, thereby the complementary data lines are supplied with the precharge voltage being about Vcc/2. The sense amplifier SA is at a non-operation state, before the RAM is at the chip non-selective state and the precharge MOSFET Q5 is turned on. As such the complementary data lines D, $\overline{D}$ hold the high level and the low level at high impedance state. If the RAM is at an operation state, the precharge MOSFET Q5 is turned off before the sense amplifier SA is at the operation state. Thereby the complementary data lines D, $\overline{D}$ hold the half precharge level during the high impedance state.

Such half precharge level is formed simply by short-circuiting the high level and the low level of the complementary data lines D, $\overline{D}$, thereby resulting in lower consumption of power. During the amplifying operation of the sense amplifier SA, since the complementary data lines D, $\overline{D}$ vary at common mode such as high level and low level with respect to the precharge level at the center, noise level generated by the capacitance coupling can be reduced.

Since the complementary data lines during the floating state are simply shortcircuited in the half precharge system, if the chip non-selective period is lengthened, the corresponding level of the data lines is decreased due to drain leak current of the address selecting MOSFET coupled to the complementary data lines. Consequently, in this embodiment, the voltage generating circuit VGG is utilized also for such level compensation although not particularly limited thereto. That is, switch MOSFET Q50, Q51 in series connection are installed between the complementary data lines D, $\overline{D}$. Output voltage VG' of the voltage generating circuit VGG is supplied to the common node connection of the MOSFET Q50 and Q51. The voltage VG' is made substantially equal to ½ Vcc. The precharge signal $\overline{\phi}$pc is supplied to gate of the MOSFET Q50, Q51, thereby the MOSFET Q50, Q51 are turned on during the precharge period only. Consequently, the voltage VG' is supplied through the switch MOSFET Q50, Q51 to the data line D, $\overline{D}$ during the chip non-selective period (precharge period). In this constitution, level compensation of the precharge voltage of the complementary data lines $\overline{D}$, D due to the leak current can be performed.

The sense amplifier SA is exemplified in a unit circuit USA. The unit circuit USA is constituted by a CMOS latch comprising P channel MOSFETs Q7, Q9 and N channel MOSFETs Q6, Q8, and a pair of input/output nodes thereof are coupled with the complementary data lines D, $\overline{D}$. The P channel MOSFET and the N channel MOSFET in the latch circuit within the same memory mat or array are commonly connected at respective sources PS and NS. The source voltage Vcc is supplied to the common source PS of the P channel MOSFET through other P channel MOSFET (not shown) as power switch, and the ground potential Vss of the circuit is supplied to the common source NS of the N channel MOSFET through other N channel MOSFET (not shown) as power switch. These power switch MOSFETs are commonly used in the latch circuit (unit circuit) installed to other similar rows within the same memory mat or array. Timing pulse $\phi$pa (complementary timing pulse $\phi$pa, $\overline{\phi}$pa in actual state) to activate the sense amplifier SA during the operation cycle is applied to the gate of the switch MOSFET. A low level read voltage supplied between a pair of data lines from the memory cell is amplified by the sense amplifier SA. Although not shown, a switch MOSFET having a gate supplied with the precharge signal $\overline{\phi}$pc is installed between the common source lines NS and PS, and the common source lines NS and PS of the sense amplifier SA are supplied with the half precharge potential during the precharge period in similar manner to the precharge operation of the complementary data lines D, $\overline{D}$.

Row selective timing of a row decoder R-DCR is controlled by word line selective timing signal $\phi$x, and the row decoder R-DCR decodes complementary address signals ao–am composed of inner address signals ao–am and $\overline{ao}$–$\overline{am}$ in reverse phase with respect to the address signals ao–am supplied from a row address buffer R-ADB, thereby word line selective signal is formed and one word line is selected.

A representative column switch C-SW comprising MOSFETs Q42, Q43 couples selectively the complementary data lines D, $\overline{D}$ and the common complementary data lines CD, $\overline{CD}$. Selective signal from a column decoder C-DCR is supplied to the gate of these MOSFETS Q42, Q43.

The row address buffer R-ADB is at operation state by timing signal (not shown) formed by a timing generating circuit TG as hereinafter described on the basis of row address strobe signal $\overline{RAS}$ supplied from an external terminal. The row address buffer R-ADB in the operation state takes and holds the address signals Ao–Am supplied from the external terminal in synchronization with the row address strobe signal $\overline{RAS}$, and forms the inner complementary address signals ao–am and transmits them to the row address decoder R-DCR. Inner address signal ao in the same phase as that of the address signal Ao supplied from the external teminal and inner address signal $\overline{ao}$ in reverse phase to the address signal Ao are represented as complementary address signal ao (and so forth). The row address decoder R-DCR decodes the complementary address signals ao–am as above described, and performs selective operation in synchronization with the line selective timing signal $\phi$x.

On the other hand, a column address buffer C-ADB is at operation state by timing signal (not shown) formed by a timing generating circuit TG as hereinafter described on the basis of column address strobe signal $\overline{CAS}$ supplied from the external terminal. The column address buffer C-ADB in the operation state takes and holds the address signals Ao–An supplied from the external terminal in synchronization with the column address strobe signal $\overline{CAS}$, and forms the inner complementary address signals ao–an and transmits them to the column address decoder C-DCR.

Column selective timing of the column decoder C-DCR is controlled by data line selective timing signal $\phi$y, and the column decoder C-DCR decodes complementary inner address signals ao–an and $\overline{ao}$–$\overline{an}$ composed of address signals in reverse phase with respect to the address signals ao–an supplied from the column address buffer C-ADB thereby forms the selective signal to be supplied to the column switch C-SW.

In FIG. 1, the row address buffer R-ADB and the column address buffer C-ADB are combined and represented as address buffer R, C-ADB.

Precharge MOSFET 44 constituting a precharge circuit in similar manner to the above description is installed between the common complementary data lines CD, $\overline{CD}$. A pair of input/output nodes of a main amplifier MA similarly constructed to the unit sense amplifier USA are coupled with the common complementary data lines CD, $\overline{CD}$. The output signal of the main amplifier MA is transmitted through a data output buffer DOB to the external terminal Dout. During a read operation, the data output buffer DOB is set at the operation state by the timing signal φrw and amplifies the output signal of the main amplifier MA and transmits the amplified signal through the external terminal Dout. During a write operation, the output of the data output buffer DOB is set in the high impedance state by the timing signal φrw.

The output terminal of a data input buffer DIB is coupled with the common complementary data lines CD, $\overline{CD}$. During a write operation, the data input buffer DIB is set at an operation state by the timing signal φrw and transmits complementary write signal according to write signal supplied from the external terminal $\overline{Din}$ into the common complementary data lines CD, $\overline{CD}$ thereby the writing of data into the selected memory cell is performed. During a read operation, the output of the data input buffer DIB is placed in the high impedance state by the timing signal φrw.

During a write operation of the dynamic memory cell composed of the address selecting MOSFET Qm and the data storing capacitor Cs as above described, in order to perform full write to the data storing capacitor Cs, in other words, in order to prevent the level loss of high level input data which is written into the data storing capacitor Cs as a result of threshold voltage of the address selecting MOSFET Qm, a word line bootstrap circuit (not shown) started by the word line selective timing signal φx is installed. The word line bootstrap circuit makes the high level of the word line selective timing signal φx higher than the source voltage Vcc using the word line selective timing signal φx and delay signal thereof.

Various timing signals as above described are formed by following the timing generating circuit TG. The timing generating circuit TG forms main timing signals shown as representative. That is, the timing generating circuit TG generates the various timing pulses in response to the address strobe signals $\overline{RAS}$ and $\overline{CAS}$ and the write enable signal $\overline{WE}$ supplied from the external terminals.

Figure 2:
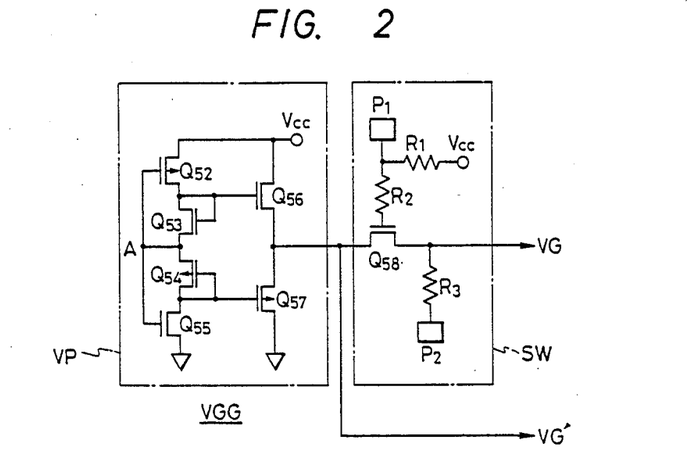
FIG. 2 is a circuit diagram of a voltage generating circuit according to the invention used in the dynamic RAM of FIG. 1.

FIG. 2 shows a circuit diagram of an embodiment of the voltage generating circuit VGG. The voltage generating circuit VGG comprises a circuit VP for generating plate voltage (for example ½ Vcc), and a switch circuit SW for changing the output level of the voltage generating circuit VGG. Between the source voltage Vcc in the plate voltage generating circuit VP and the voltage dividing point (Vcc/2 or node A), P channel MOSFET Q52 and N channel MOSFET Q53 with drain and gate commonly connected in diode form are connected in series. Between the dividing point A and the ground potential Vss of the circuit, P channel MOSFET Q54 with gate and drain commonly connected in diode form and N channel MOSFET Q55 are connected in series. Although not particularly limited, the gate of MOSFETs Q52 and Q55 are connected to the dividing point A and therefore act as resistance means. The conductances of MOSFET Q52 and Q55 are made small and, as such, the corresponding DC current flowing therethrough is set to a small value.

The commonly connected gate, drain of the N channel MOSFET Q53 in diode form is supplied to the gate of N channel output MOSFET Q56. The commonly connected gate, drain of the P channel MOSFET Q54 in diode form is supplied to the gate of P channel output MOSFETs Q57. The output MOSFET Q56, Q57 of the plate voltage generating circuit VP are connected at their drain to the power source voltage Vcc and the ground potential of the circuit respectively, and commonly connected at their source so as to transmit the output voltage VG'. The output voltage generating circuit VP is supplied to a level compensation circuit of precharge level in the complementary data lines D, $\overline{D}$.

In order to prevent DC (through) current from flowing through both output MOSFET Q56 and Q57, in other words, in order to prevent both MOSFET Q56, Q57 from being turned on simultaneously by the dividing voltage Vcc/2, threshold voltage Vthn1 of the MOSFET Q53 is set in absolute value smaller than threshold voltage Vthn2 of the output MOSFET Q56 corresponding to the MOSFET Q53, and threshold voltage Vthp1 of the MOSFET Q54 is set in absolute value smaller than threshold voltage Vthp2 of the output MOSFET Q57 corresponding to the MOSFET Q54.

For example, when the output voltage VG' is Vcc/2, source potential of the output MOSFET Q56 is made Vcc/2. However, the gate potential of the output MOSFET Q56 attains the voltage (Vcc/2+Vthn1) where the dividing voltage Vcc/2 is level-shifted higher than the threshold voltage of the MOSFET Q53 in diode form. In this state, since only the threshold voltage Vthn1 of the MOSFET Q53 being smaller than the threshold voltage Vthn2 of the MOSFET Q56 is applied between gate and source of the MOSFET Q56, the MOSFET Q56 is turned off. This is similar also in the P channel output MOSFET Q57. Consequently, since both output MOSFET Q56 and Q57 are turned off, DC current does not flow through both MOSFET Q56, Q57.

As the power source voltage Vcc rises, the relative voltage between VG' and the gate potential of the output MOSFET Q56 (Vcc/2+Vthn1) decreases. If the relative difference in voltage becomes larger than Vth2, the MOSFET Q56 is turned on and the output voltage VG' rises to Vcc/2+Vth1−Vth2. When the source voltage Vcc rises in such manner, the P channel MOSFET Q57 maintains the off state because the voltage between the gate and source is reverse biased further according to the gate potential (Vcc/2 −Vthp1) rises.

As the power source voltage Vcc decreases, the relative voltage between VG' and the gate potential of the output MOSFET Q57 (Vcc/2−Vthp1) decreases. If the difference voltage becomes larger than Vthp2, the MOSFET Q57 is turned on. The on state of the MOSFET Q57 reduces the output voltage VG' to Vcc/2−Vthp1+Vthp2. When the source voltage Vcc decreases in such manner, the N channel MOSFET Q56 maintains the off state because the voltage between the gate and source is reverse biased further as a result of the gate potential Vcc/2+Vthn1) decreasing.

If the source voltage Vcc is constant and the voltage VG' varies due to the leak current, when the variation with respect to the dividing voltage Vcc/2 goes beyond the difference between the threshold voltage Vthn1 and Vthn2 of corresponding MOSFETs Q53 and Q56 or beyond the difference between the threshold voltage Vthp1 and Vthp2 of corresponding MOSFETs Q54 and Q57, the output MOSFET Q56 or Q57 is turned on thereby effecting in level compensation.

Output MOSFETs Q56 and Q57 are not turned on simultaneously, and the operation current is entirely as a result of the output current. Consequently, conductance of the output MOSFETs Q56 and Q57 is set large thereby the output current can by made large, in other words, the output impedance can be made small.

In this embodiment, in order to estimate the process variation of the capacitance value of the MIS capacitor Cs to constitute the memory cell, the output voltage VG' is supplied through the switch circuit SW to the gate electrode (plate) of the MIS capacitor Cs. More specifically, the output voltage VG' is supplied, for example, to the input side of N channel switch MOSFET Q58 which operates as a transmission gate. Although not particularly limited, thereto gate of the N channel switch MOSFET Q58 is continuously supplied with the source voltage Vcc through series resistors R1, R2. In order to be able to selectively turn off the switch MOSFET Q58, an electrode P1 is connected to the junction point of the resistors R1 and R2. When a low voltage level, such as the ground potential of the circuit, is supplied to the electrode P1, MOSFET Q58 can be turned off.

An electrode P2 to supply any bias voltage is connected through a resistor R3 to the output side of the switch MOSFET Q58. Thereby when the MOSFET Q58 is turned off, predetermined bias (test) voltages from the electrode P2 can be supplied to the gate of the MIS capacitor Cs.

The electrodes P1 and P2 are testing electrodes not to be connected to external terminals, although not particularly limited thereto. Consequently, during a probing test after the dynamic RAM is completed on the semiconductor wafer, the electrode P1 is supplied with the ground potential of the circuit from the probe and the electrode P2 is supplied with predetermined bias voltages from the tester side through the probe.

Figure 3:
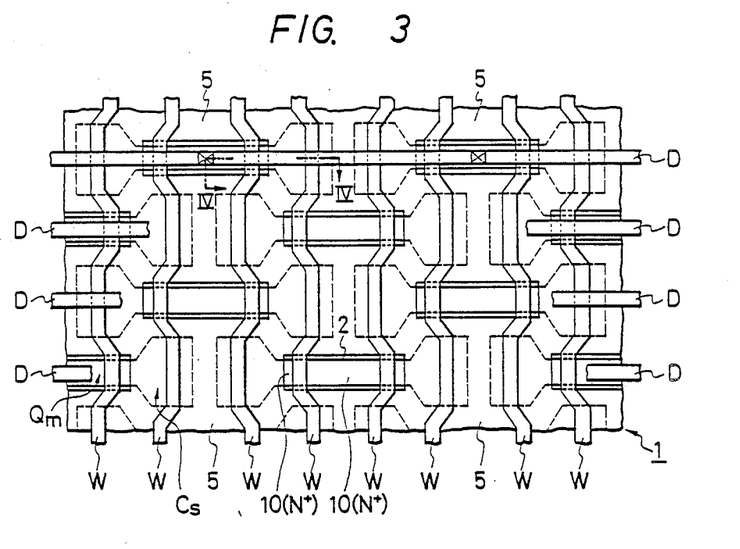
FIGS. 3 and 4 are a plan view and a sectional view illustrating the dynamic cell respectively.
Figures 4, 5, 6:
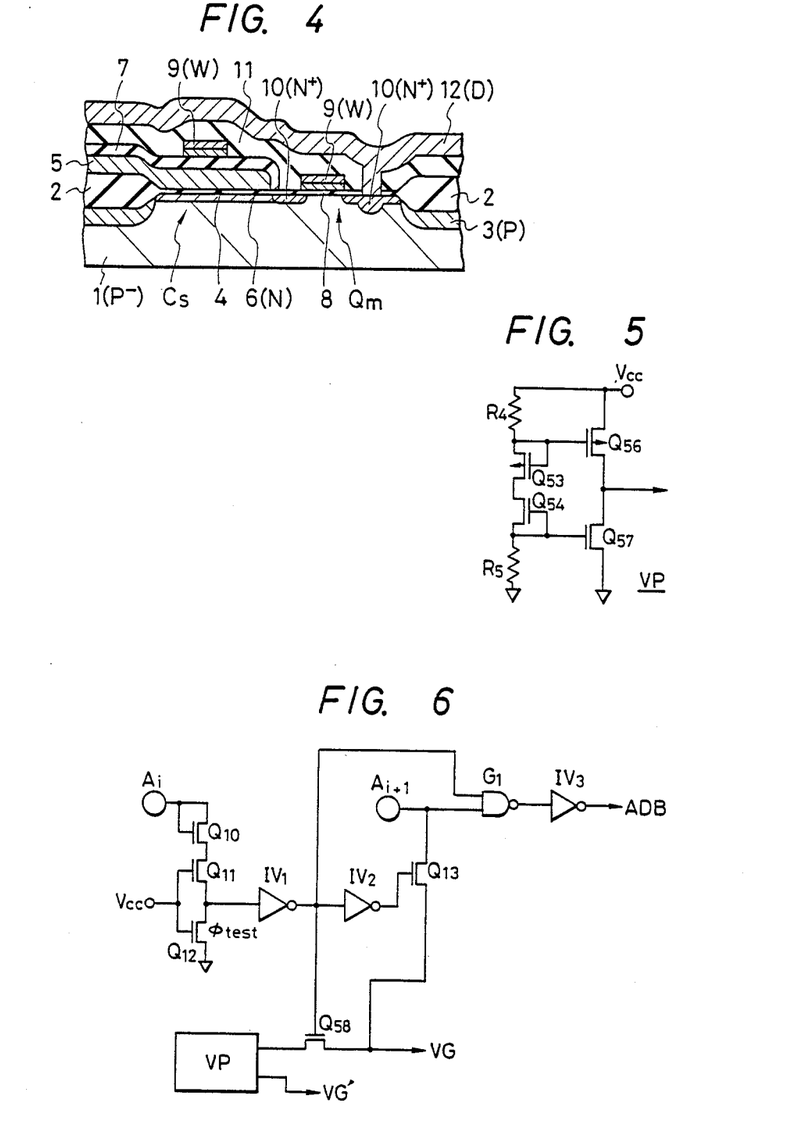
FIG. 5 is a circuit diagram illustrating a modification of the circuit in FIG. 2.
FIG. 6 is a circuit diagram illustrating another embodiment of the invention.
Figure 4:
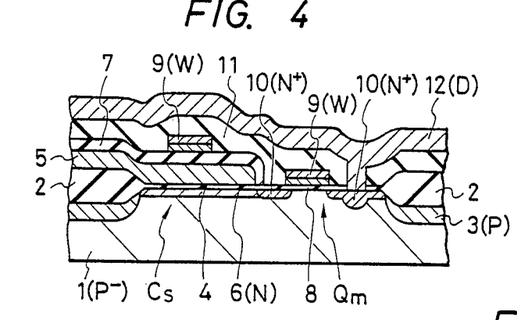
Figure 5:
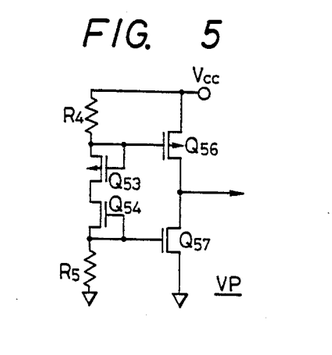
Figure 6:
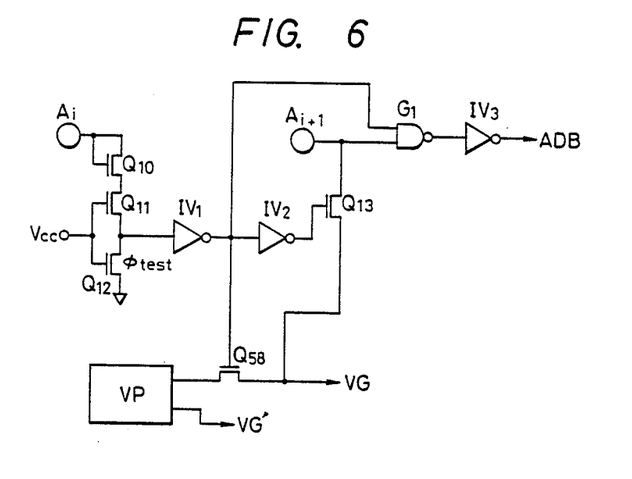

The memory cell and the memory array of the dynamic RAM are constituted as shown in FIG. 3 and FIG. 4. FIG. 4 shows a sectional view taken along line IV—IV in FIG. 3. On the surface of a semiconductor substrate 1 made of monocrystal-line P⁻ type silicon is formed a thick field insulating film 2 selectively by means of known local oxidation. P type channel stopper 3 is formed under the field insulating film 2. The field insulating film 2 and the channel stopper 3 isolate the memory cells from each other.

The capacitor Cs comprises two electrodes, a first level local polycrystalline silicon layer 5 and N type semiconductor region 6, and a thin insulating film 4 as dielectrics. The insulating film 4 is constituted by a silicon oxide film of a single layer or a composite film of a silicon oxide film and a silicon nitride film. Voltage VG is supplied from the voltage generating circuit VGG to one electrode 5 to which fixed potential is to be applied. The electrode 5 is formed as electrode common to a plurality of memory cells. Consequently, the polycrystalline silicon layer 5 is wholly formed in plate except for the MOSFET forming region within the memory array as shown in FIG. 3. In FIG. 3, for the purpose of explaining the form of the electrode 5, the insulating film (except for the field insulating film 2) is not shown and a part of the data line D is omitted.

The N channel MOSFET as represented by the MOSFET Qm of the memory cell comprises a gate insulating film 8, a gate electrode 9, and N⁺ type semiconductor regions 10 as the source and drain region. The gate electrode 9 comprises, for example, a polycrystalline silicon layer and a refractory metal silicide layer stacked thereon, and extends in one direction within the memory array so as to constitute a word line W.

The semiconductor substrate 1 is supplied with negative back bias voltage -Vbb from a substrate bias voltage generating circuit VBG. In this constitution, since parasitic capacitance value between source, drain and the substrate in the N channel MOSFET is decreased, the circuit can be operated at high speed and minority carriers generated on the substrate can be absorbed, thereby lengthening the refresh period. A conductive layer 12 of aluminium is formed on an interlayer insulating film 11 of phospho-silicate glass to cover each circuit element such as memory cell. The conductive layer 12 is electrically connected to the semi-conductor region 10 through a contact hole provided on the insulating film 11. The conductive layer 12 extends in one direction within the memory cell array so as to constitute a data line D.

Although not shown, P channel MOSFET is formed in N type well region formed on the semiconductor substrate 1. Substrate gate of the P channel MOSFET, i.e., the N type well region is connected to the power source terminal Vcc in FIG. 1.

The capacitance value of the capacitor Cs in the memory cell varies according to the manufacturing process. For example, variation of film thickness of the insulating film 4 and variation in ion implantation to form the semi-conductor region 6 are the cause for the variation of the capacitance value.

Probe test is performed during the state of semiconductor wafer before dicing in order to detect any capacitance value decrease of the capacitor Cs as a result of the process variation and in order to detect the small destruction voltage (large leak current) of the insulating film 4 of the capacitor Cs.

During the test, the probe of the tester is contacted with each external terminal and testing electrodes P1, P2 within a region constituting the dynamic RAM region of one chip. Signals required for the operation of the dynamic RAM are supplied from the testor through the probe. Except for voltage supplied to the electrodes P1, P2, i.e., the plate voltage VG, signals similar to that in ordinary operation of a known dynamic RAM are supplied in similar timing.

The following test can be performed according to the voltage generating circuit in FIG. 2. The electrode P1 is set to the ground potential, and the electrode P2 is set to ½ Vcc. In this state, high level signal (signal to set the potential of the electrode 6 to high level = Vcc) is written in the memory cell. Next, in the state where the potential smaller than ½ Vcc (for example 0 V) is supplied to the electrode P2, the written data is read and examination is performed as to whether the data has been read correctly.

This test approximates soft error of the memory cell mode being greater part of the soft error. That is, potential reduction of the storage node due to reduction of the plate voltage is deemed as decrease of the charge due to entering of β ray.

The capacitance value required to realize some soft error rate (for example 1000 Fit) is found, and variation of the plate voltage corresponding to the capacitance value is previously estimated. When potential variation corresponding to the soft error rate of 1000 Fit is supplied to the electrode P2 and the correct data is read, the memory cell is deemed to be accepted. On the contrary, if the inversed data is read, the memory cell is deemed defective. Also, potential supplied to the electrode P2 when the data is inverted the capacitance value of the capacitor Cs can be known.

In the above-mentioned test, after low level signal (signal to set the potential of the electrode 6 to low level = 0 V) may be written in the memory cell, and voltage larger than ½ Vcc may be supplied too the electrode P2 and the data be read. This test examines characteristics of the capacitor Cs in reverse polarity to the proceeding test.

The following test can be performed to examine the strength of the insulating film 4. In the state that the electrode P2 is supplied with 7 V for example, low level signal is written in the memory cell. Or, when the electrode P2 is supplied with the ground potential, high level signal is written in the memory cell. In this case, by making the power source voltage 7 V, the high level signal is also made about 7 V. The writing state is held in the memory cell for several seconds. And then the writing and the reading are performed in similar manner to ordinary operation, and examination is performed regarding whether the insulating film 4 is destroyed or not. The destroyed dynamic cell is removed as defective article with initial failure.

When the electrode P2 is supplied with negative potential and the electrode P1 is also supplied with negative potential in order that the MOSFET Q58 is not turned on, the test for a negative plate voltage VG can be performed.

When the electrodes P1, P2 are at floating state, known tests can be performed.

In the tests above described, predetermined test voltages, which are limited to a certain range, are applied to the electrode P2. Since the insulating film 4 of the capacitor Cs has a breakdown (or destruction) voltage which mainly depends on its thickness, the voltages applied between the two electrodes 5 and 6 of the capacitor Cs should be set smaller than at least the breakdown voltage in order not to destroy the insulating film 4 which has an sufficient breakdown voltage (e.g. 7 V-10 V). Accordingly, the predetermined test voltages are defined so as to satisfy the above condition taking the potential of another electrode 6 into consideration.

When the insulating film 4 is made of silicon dioxide and has a thickness of 10nm and a breakdown voltage of about 10 V, predetermined test voltages are as follows: In the case where the potential of the electrode 6 is 0 V to 5 V, predetermined test voltages are about −10 V−+15 V. In the case where the potential of the electrode 6 is 0 V to 7 V, the predetermined test voltages are about −10 V−+17 V. In applying any of the predetermined test voltages to the electrode 5 (or test electrode P2), a voltage between the electrodes 5 and 6 should be lower than the breakdown voltage. For example, when a predetermined test voltage of +15 V is applied to the electrode 5, potential of the electrode 6 is set at 5 V.

Taking voltage margin such as 1 V-3 V for test is preferable in order to avoid destruction of the insulating film. That is, the predetermined test voltages are changed to about −9 V−+14 V or −9 V−+16 V in 1 V margin and to about −7 V−+12 V or −7 V−+14 V in 3 V margin.

The predetermined test voltages can be changed according to the breakdown voltage of the insulating film 4, voltage margin for test and potential of the electrode 6 in test.

During ordinary operation, the electrodes P1, P2 are at a floating state. That is, the electrodes P1, P2 are not connected to the external terminals. Consequently, in the ordinary operation state, the source voltage Vcc is supplied to the gate of the MOSFET Q58 through resistors R1 and R2. Thus the MOSFET Q58 is turned on, and voltage of about Vcc/2 formed by the voltage generating circuit VGG is supplied to one electrode of the capacitor Cs. And then similar operation to know dynamic RAM is performed.

The invention has following effects.

(1) Gate of the MOS capacitor to constitute the dynamic memory cell can be supplied with a predetermined testing voltage, thereby substantial capacitance value of the MOS capacitor can be varied. Consequently, bias voltage to decrease the substantial capacitance value in comparison to ordinary operation state is supplied and write/read operation is performed thereby margin of the stored charge of the MOS capacitor can be directly estimated.

(2) Selection of the dynamic RAM having high reliability can be performed according to item (1).

(3) As voltage generating circuit to supply to gate of the MOS capacitor, N channel output MOSFET and P channel output MOSFET in a source follower type configuration are connected in series and the output voltage is obtained from the common source point, and wherein the gate of each output MOSFET is supplied with a common dividing voltage level shifted by a MOSFET operatively connected as a diode and being of the same conductivity type and having a threshold voltage larger in absolute value than that of the respective corresponding output MOSFET so as to prevent DC current from simultaneously flowing through both output MOSFETS. In this constitution, current flowing through the output MOSFET can be entirely used as output current and therefore the power consumption becomes low.

(4) Plate voltage of the memory cell of the dynamic RAM (gate potential of the MOS capacitor) in half precharge system is made equal to the half precharge potential, thereby reference potential of the data storing capacitor can be varied following the half precharge potential (read reference potential) varying corresponding to variation of the source voltage Vcc. In this constitution, since voltage held in the data storing capacitor by the power source variation is varied following the half precharge potential, the level margin becomes large and therefore the dynamic RAM of large level margin can be obtained together with effect in item (1).

Although the invention has been specifically described in conjunction with the preferred embodiments, the invention is not limited to the specific embodiments illustrated but rather various modifications may be made without departing from the spirit and scope of the invention.

Construction of the voltage generating circuit VGG may have various modifications. Referring to FIG. 5, a polysilicon layer having high resistance value may be used in place of the MOSFETs Q52, Q55 shown in FIG. 2. In this case, the dividing voltage (for example Vcc/2) with high accuracy can be formed according to pattern ratio without being influenced by the process variation of the resistance value in absolute value of the individual polysilicon layers. In order to effect a different threshold voltage between the MOSFET in diode form in the voltage generating circuit VGG and the output MOSFET corresponding thereto, the ion implantation to channel portion, use of different channel of the MOSFET, use of different thickness of the gate insulating film, and other various executing manners may be taken. The switch circuit SW also may take various constitutions. In place of the MOSFET Q58, CMOS transmission gate composed of the N channel and P channel MOSFET may be used. Output voltage of the plate voltage generating circuit VP and bias voltage for estimation of the memory cell may be changed using two switch MOSFET operating complementarily by the changing signal.

The electrode P1 supplying the voltage changing signal and the electrode P2 supplying the bias voltage may be connected to the external terminal so that the estimation can be performed after the dynamic RAM is completed (packaged). In this case, the number of the external terminal is increased by two.

The estimation can be performed after the dynamic RAM is completed without increasing the number of external terminals. In this case, address signal supplying external terminals Ai, Ai+1 may be used arbitrarily as shown in FIG. 6. Voltage discrimination circuit comprising the N channel MOSFET Q10, Q11, Q12 added to the external terminal Ai outputs the test signal $\phi test$ which is made a high level during the test. The signal $\phi test$ is made a high level when voltage (for example 6.5 V) higher than the source voltage Vcc (=5 V) by sum of the threshold voltage of the MOSFET Q10, Q11 is applied to the external terminal Ai. The high level of the signal $\phi test$ is inverted by an inverter IV1 and the MOSFET Q58 is turned off and two-input NAND gate G1 is closed, and the MOSFET Q13 is turned on through inverters IV1, IV2. In this constitution, signals from the external terminal Ai+1 to the address buffer ADB are fixed to low level, and output of the plate generating circuit VP is cut. In this state, predetermined test voltage is supplied to the external terminal Ai+1 and is used as the plate voltage VG. Similar test is performed regarding a plurality of memory cells being common in address corresponding to the external terminals Ai, Ai+1. Input from the external terminal Ai to the address buffer ADB is also made ineffective.

The memory cell may be any type as long as it has a capacitor to supply the fixed potential to on electrode during the operation. That is, the memory having a capacitor using trench or moat formed within the substrate, a capacitor using two electrode stacked on the semiconductor substrate, a capacitor using the semiconductor region within the semiconductor substrate as an electrode supplying the fixed potential, or the like may be used. The fixed potential to be applied to one electrode of the capacitor may be the power source voltage or the ground potential other than the voltage ½ Vcc. Construction of the voltage generating circuit may be varied corresponding to the required plate voltage.

Read reference potential of the memory cell may be effected using a dummy cell.

Other peripheral circuits to constitute the dynamic RAM may take various executing forms. For example, the address signal may be supplied from the independent external terminals. A well-known automatic refresh circuit may be installed. The memory cell and peripheral circuits thereof may be constituted by MIS (metal insulator semi-conductor) FET in place of the MOSFET.

The invention can be widely utilized in the dynamic RAM including open bit line type. The invention can be applied also to pseudo static RAM having the memory cell of 1 MOSFET type. It can be widely used in the semiconductor memory having a capacitor within the memory cell.

What is claimed is:

1. A semiconductor memory comprising:
   a memory cell including a data storage capacitor, having a pair of electrodes, and a MISFET coupled in series with said capacitor;
   a voltage generating circuit, powered by a power source voltage, for providing a voltage of about a half of said power source voltage to one of said pair of electrodes, the other of said pair of electrodes being coupled to said MISFET;
   voltage supply means for supplying a predetermined test voltage to said one electrode;
   switch means coupled for supplying either the voltage from said voltage generating circuit or the voltage from said voltage supply means to said one electrode; and
   wherein said voltage generating circuit comprises a voltage dividing circuit which has a first resistor means having one end coupled to said power source voltage, a second resistor means having one end coupled to a predetermined source voltage, a first node, a first MISFET of a first channel conductivity type, configured to operate as a diode, coupled between a second end of said first resistor means and said first node, and a second MISFET of a second channel conductivity type, configured to operate as a diode, coupled between a second end of said second resistor means and said first node, a first output MISFET of said first channel conductivity type having a gate connected to the common connection of said first MISFET and said first resistor means, and a second output MISFET of said second channel conductivity type having a gate connected to the common connection of said second MISFET and said second resistor means and having its source connected to the source of said first output MISFET, and wherein said first and second MISFETs have threshold voltage levels of absolute value smaller than that of the corresponding first and second output MISFETs, respectively and wherein, an output voltage of about half of said power source voltage is obtained from said common source connection of said first and second output MISFETs.

2. A semiconductor memory according to claim 1, wherein said first and second resistor means comprise a third MISFET of said second channel conductivity type and a fourth MISFET of said first channel conductivity type, respectively, and wherein the gate of said third MISFET is coupled to the gate of said fourth MISFET and to said first node.

3. A semiconductor memory according to claim 2, wherein said semiconductor memory is a random access memory and wherein said power source voltage corresponds to the operating voltage source of said semiconductor memory.

4. A semiconductor memory according to claim 2, wherein said voltage supply means includes an electrode to which said predetermined voltage is applied.

5. A semiconductor memory according to claim 4, wherein said electrode is a testing electrode.

6. A semiconductor memory according to claim 4, wherein said electrode is one of external terminals to which an address signal is supplied.

7. A semiconductor memory according to claim 4, wherein said switch means comprises a switch MISFET coupled between said voltage generating circuit and said one electrode, and wherein voltage from said voltage supply means is supplied between the switch MISFET and said one electrode.

8. A semiconductor memory according to claim 7, wherein said electrode is a testing electrode.

9. A semiconductor memory according to claim 8, said switch means further comprising third and fourth resistor means connected in series between the gate of said switch MISFET and the power source voltage terminal, and a testing electrode is coupled to a node corresponding to the common connection of said third and fourth resistor means.

10. A semiconductor memory according to claim 1, wherein said first and second resistor means comprise first and second resistors, respectively.

11. A semiconductor memory comprising:
a memory cell including a data storage capacitor, having a pair of electrodes, and a MISFET coupled in series with said capacitor;
a voltage generating circuit for providing a voltage to be supplied to one of said pair of electrodes of said capacitor;
voltage supply means for supplying a predetermined test voltage to said one electrode of said capacitor, wherein said voltage supply means includes a testing electrode to which said predetermined voltage is applied; and
switch means for supplying either the voltage from said voltage generating circuit or the voltage from said voltage supply means to said one electrode comprising a switch MISFET coupled between said voltage generating circuit and said one electrode, and wherein voltage from said voltage supply means is supplied between said switch MISFET and said one electrode of said capacitor, and wherein said switch means further comprises third and fourth resistor means connected in series between the gate of said switch MISFET and the power source voltage terminal, and a further testing electrode is coupled to a node corresponding to the common connection of said third and fourth resistor means.

12. In a dynamic random access memory having an array of memory cells, each cell including a series arrangement of a MISFET and a storage capacitor coupled between a data line and a bias voltage, a combination comprising:
voltage generating means powered by a power source voltage for providing a regulated voltage of about half of said power source voltage for application to each said storage capacitors a said bias voltage comprising first and second resistance means, first and second diode means and first and second series-connected MISFETs of complementary channel type, wherein said first resistance means is coupled between said power source voltage and the common connection of one end of said first diode means and the ate of said first MISFET, said second resistance means is coupled between a predetermined reference voltage and the common connection of a first end of said second diode means and the gate of said second MISFET, said second end of said first and second diode means being commonly coupled, wherein the common connection of said MISFETs effects in a source follower output of about half of said power source voltage, and wherein said respective first and second diode means and said first and second MISFETs have threshold levels so as to preclude simultaneous conduction through said first and second MISFETs;
voltage supply means for supplying a predetermined test voltage as said bias voltage; and
switch means, coupled to said voltage supply means and coupled between the common connection of said MISFETs of said voltage generating means and said memory cell capacitors for selectively supplying either the voltage from said voltage generating means or the voltage from said voltage supply means as said storage capacitor bias voltage.

13. The dynamic random access memory according to claim 12, wherein said first resistance means, said second diode means and said second MISFET are effected from P-channel MISFETs;
second resistance means, said first diode means and said first MISFET are effected from N-channel MISFETs;
said first diode means MISFET has its gate and drain coupled to the gate of said first MISFET and the drain of said first resistance means MISFET;
said second diode means MISFET has its gate and drain coupled to the gate of said second MISFET and the drain of said second resistance means MISFET;
said gate of both said first and second resistance means MISFETs being coupled to the source of both said first and second diode means MISFETS; and
said drain of said first and second MISFETs being coupled to said power source voltage and said predetermined reference voltage, respectively.

14. The dynamic random access memory according to claim 13, wherein said voltage supply means includes electrode to which said predetermined test voltage is applied, said switch means comprises a MISFET transmission switch coupled between a terminal for supplying said storage cell capacitors with said bias voltage and said source follower output, and wherein voltage from said voltage supply means is supplied between said transmission switch MISFET and said terminal.

15. The semiconductor memory according to claim 14, wherein said switch means further comprising third and fourth resistor means connected in series between the gate of said switch MISFET and the power source voltage terminal, and a testing electrode is coupled to a node corresponding to the common connection of said third and fourth resistor means.

* * * * *